United States Patent
Oh

(10) Patent No.: US 12,416,083 B2
(45) Date of Patent: Sep. 16, 2025

(54) SUBSTRATE PROCESSING APPARATUS

(71) Applicant: ASM IP Holding, B.V., Almere (NL)

(72) Inventor: YongSeok Oh, Chungju-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/361,442

(22) Filed: Jul. 28, 2023

(65) Prior Publication Data

US 2024/0044005 A1 Feb. 8, 2024

Related U.S. Application Data

(60) Provisional application No. 63/394,354, filed on Aug. 2, 2022.

(51) Int. Cl.
*C23C 16/52* (2006.01)

(52) U.S. Cl.
CPC ..................... *C23C 16/52* (2013.01)

(58) Field of Classification Search
CPC ...................................... C23C 16/52
See application file for complete search history.

(56) References Cited

U.S. PATENT DOCUMENTS

| | | | |
|---|---|---|---|
| 6,070,550 A * | 6/2000 | Ravi | H01L 23/5329 257/E21.271 |
| 7,201,936 B2 | 4/2007 | Schwarm | |
| 7,225,047 B2 | 5/2007 | Al-Bayati | |
| 7,354,332 B2 | 4/2008 | Surana | |
| 7,698,012 B2 | 4/2010 | Shanmugasundram | |
| 7,959,395 B2 * | 6/2011 | Hofmeister | H01L 21/67161 414/217 |
| 8,210,196 B2 * | 7/2012 | Itafuji | H01L 21/67253 137/492.5 |
| 8,694,145 B2 | 4/2014 | Shanmugasundram | |
| 11,024,523 B2 * | 6/2021 | Oosterlaken | H01L 21/67757 |
| 2004/0157446 A1 * | 8/2004 | Kashino | C30B 29/06 438/689 |
| 2007/0209932 A1 * | 9/2007 | Sferlazzo | C23C 14/568 204/298.16 |
| 2009/0147819 A1 * | 6/2009 | Goodman | G01K 15/00 374/1 |
| 2009/0246374 A1 * | 10/2009 | Vukovic | C23C 16/45563 427/255.28 |

(Continued)

FOREIGN PATENT DOCUMENTS

| | | | | |
|---|---|---|---|---|
| JP | 7-74152 | * | 3/1995 | H01L 21/3065 |
| JP | 2021-90042 | * | 6/2021 | H01L 21/31 |
| WO | WO 2012/103188 A2 * | 8/2012 | | G06T 7/40 |

*Primary Examiner* — Bret P Chen
(74) *Attorney, Agent, or Firm* — Banner & Witcoff, Ltd.

(57) ABSTRACT

A substrate processing apparatus may be presented. The apparatus comprising a reaction chamber configured to hold a substrate, a deposition system to deposit a layer on the substrate according to a recipe, an automatic deposition compensation system comprising a calculator programmed: to calculate an accumulated layer thickness (x) deposited on the inside of the reaction chamber by the deposition system as a function of the recipes run in the reaction chamber and, to calculate an offset value (y) as a function of the accumulated layer thickness (x). The automatic deposition compensation system may be connected to the deposition system to adjust the recipe ran by the deposition system with the offset value (y).

9 Claims, 6 Drawing Sheets

(56) References Cited

U.S. PATENT DOCUMENTS

| | | | |
|---|---|---|---|
| 2010/0227046 A1* | 9/2010 | Kato | H01L 21/67253 |
| | | | 118/712 |
| 2012/0234230 A1* | 9/2012 | Halpin | C30B 29/06 |
| | | | 117/97 |
| 2016/0211135 A1* | 7/2016 | Noda | C23C 16/52 |
| 2017/0058403 A1* | 3/2017 | Bucci | C23C 16/45593 |

* cited by examiner

SUBSTRATE PROCESSING APPARATUS

CROSS-REFERENCE TO RELATED APPLICATIONS

This Application claims the benefit of U.S. Provisional Application 63/394,354 filed on Aug. 2, 2022, the entire contents of which are incorporated herein by reference.

TECHNICAL FIELD

The present disclosure relates to an apparatus for processing a substrate, particularly to an apparatus which can automatically adjust recipe parameters.

BACKGROUND

The recipe for substrate processing may determine the deposition in the reaction chamber. To secure and maintain the substrate thickness to a target value, users or operators of the substrate reaction chambers may regularly adjust specific parameters (plasma power, cycle, temperature, etc.) in the recipe.

However, if an operator may change the parameters manually, it may not only be inconvenient and slow but also there may be a possibility of errors from the human factor.

This disclosure may provide a way to adjust the recipe to ensure substrate quality.

SUMMARY

In accordance with one embodiment there may be provided, a substrate processing apparatus comprising a reaction chamber configured to hold a substrate, a deposition system to deposit a layer on the substrate according to a recipe, and an automatic deposition compensation system. The automatic compensation system may comprise a calculator programmed: to calculate an accumulated layer thickness (x) deposited on the inside of the reaction chamber by the deposition system as a function of the recipes run in the reaction chamber, and to calculate an offset value (y) as a function of the accumulated layer thickness (x), and the automatic deposition compensation system may be connected to the deposition system to adjust the recipe ran by the deposition system with the offset value (y).

In an aspect, the recipe may be adjusted with the offset value (y), and the offset value (y) may be derived from an equation selected from linear, quadratic, cubic, or higher order equation.

In an aspect, the offset value (y) may be derived by a cubic equation: $y=ax^3+bx^2+cx+d$, (y: offset value, x: accumulated layer thickness, a, b, c, d: arbitrary values).

In an aspect, the apparatus may be a plasma enhanced deposition apparatus provided with a plasma generator and a cubic equation may be used to adjust a plasma power of the plasma generator.

In an aspect, the apparatus may be provided with a user interface operably connected to the automatic deposition compensation system and programmed so that the values a, b, c and d can be entered via the user interface into the system.

In accordance with another embodiment, a substrate processing method used in an apparatus comprising a reaction chamber configured to hold a substrate may be provided. The method may comprise depositing a layer on the substrate according to a recipe with a deposition system, calculating an accumulated layer thickness (x) deposited on the inside of the reaction chamber by the deposition system as a function of the recipes run in the reaction chamber with an automatic deposition compensation system comprising a calculator, and calculating an offset value (y) as a function of the accumulated layer thickness (x) with the calculator using an equation, and adjusting the recipe ran by the deposition system with the offset value (y).

In an aspect, the equation may be one of a linear, quadratic, cubic, and higher order equation.

In an aspect, the offset value (y) may be derived from a cubic equation: $y=ax^3+bx^2+cx+d$, (y: offset value, x: accumulated layer thickness, a, b, c, d: arbitrary values).

In accordance with another embodiment there may be provided, a substrate processing apparatus comprising a reaction chamber configured to hold a substrate; a deposition system to deposit a layer on the substrate according to a recipe; and an automatic deposition compensation system. The automatic deposition compensation system may comprise a calculator programmed: to calculate an accumulated layer thickness (x) deposited on the inside of the reaction chamber by the deposition system as a function of the recipe run in the reaction chamber; and, to calculate an offset value (y) as a function of the accumulated layer thickness (x), and the automatic deposition compensation system is connected to the deposition system to adjust the recipe ran by the deposition system with the offset value (y), a user interface operably connected to the automatic deposition compensation system and the user interface configured to receive values from an operator, and a memory unit configured to save the values.

In an aspect, the offset value (y) may be derived by a cubic equation: $y=ax^3+bx^2+cx+d$, (y: offset value, x: accumulated layer thickness, a, b, c, d: values saved in the memory unit).

BRIEF DESCRIPTION OF THE DRAWINGS

The invention may be better explained by the detailed description of the embodiments and from the drawings, which are meant to illustrate and not to limit the invention, and wherein.

It may be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

The present disclosure may provide a method to change the recipe automatically for better substrate quality. The present disclosure will be explained with figures.

Due to the residue gas during substrate processing, it may be not unusual for substrate deposition apparatus to deposit thicker layers than the recipe's target thickness. To cope with this, it may be necessary to change or adjust specific parameters such as plasma power, cycle period, or temperature in a recipe regularly.

The present disclosure may present a way to compensate the thickness automatically.

Figure 1:
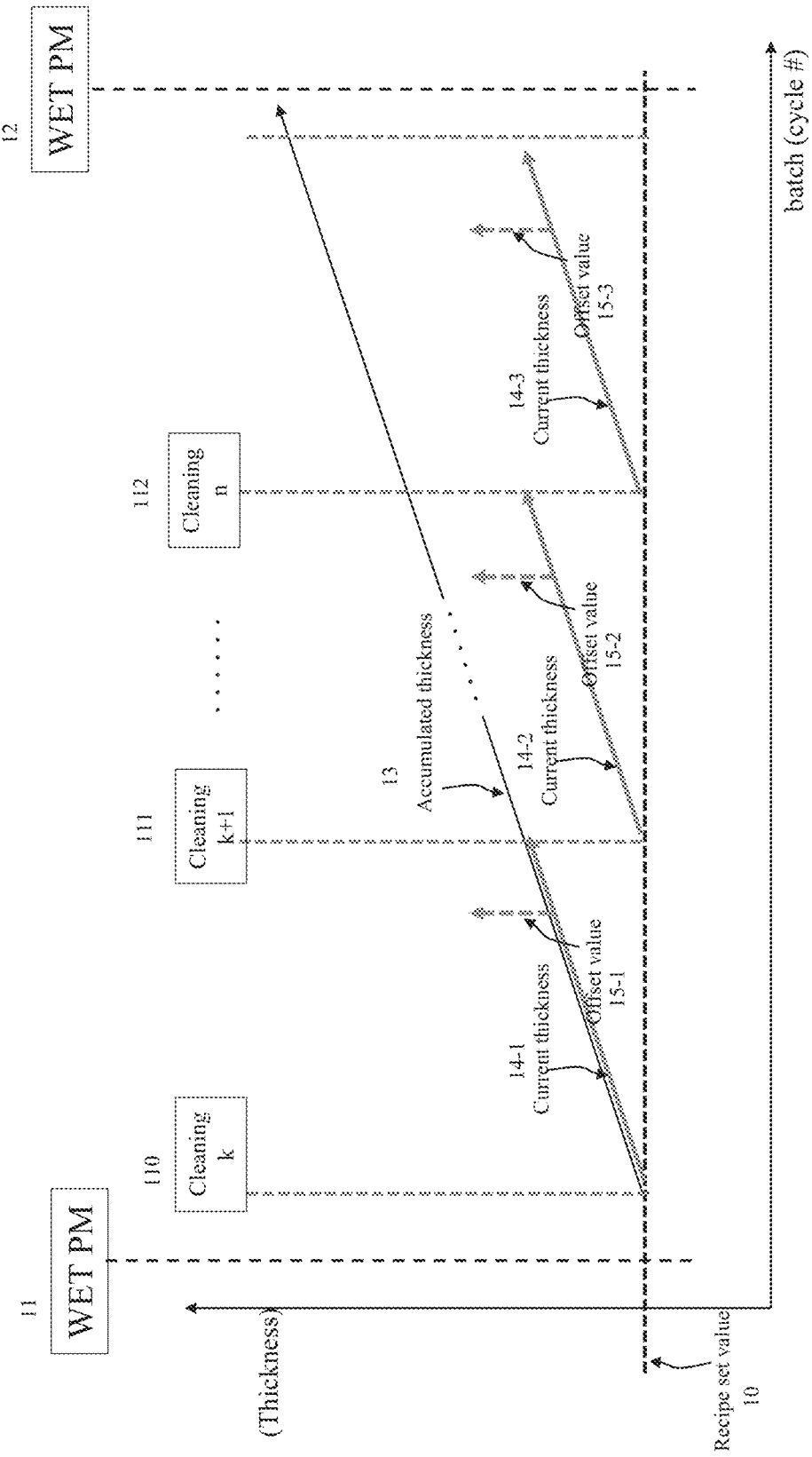
FIG. 1 shows the compensation periods and the variation of the thickness according to an embodiment of the present disclosure.

FIG. 1 shows the compensation periods of the present disclosure.

Basically, accumulated thickness 13 may be continuously increasing between WET PM (wet prevention maintenance) 11 and WET PM 12. It should be noted that the slope of the accumulated thickness 13 is somewhat exaggerated to show the effects more easily.

When performing wet prevention maintenance 11, 12, the compensation thickness 13 may be reset.

Recipe set value 10 may show the recipe's target deposition thickness of substrates in a deposition process. As shown, accumulated thickness 13 may increase as cycles (x-axis) have been processed. Current thickness 14-1, 14-2, 14-3 are the thickness accumulated between cleanings 110, 111, 112. The thickness (y-axis) tends to increase mainly because the process gas residues remain in the chambers in small quantities after each process. Due to this thickness increase, there should be a correction method for the substrate thickness and this present disclosure may presents an automatic method therefor.

Figure 2:
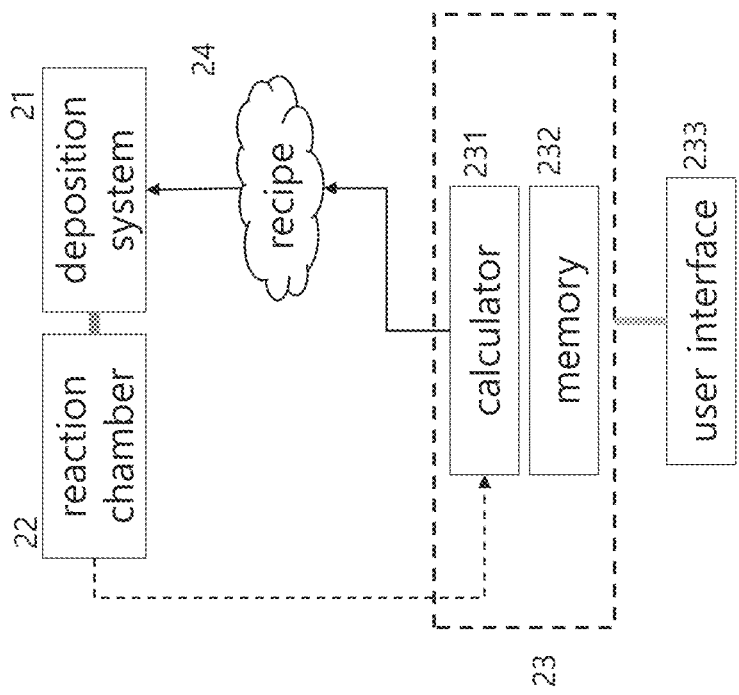
FIG. 2. shows a substrate processing apparatus according to an embodiment of the present disclosure.

In FIG. 2, the present disclosure's apparatus may be shown. Reaction chamber 22 may hold the substrate for deposition processing and deposition system 21 which may be run on a recipe 24 deposits layers on the substrate in the reaction chamber 22. Automatic deposition compensation system 23 may calculate both the thickness accumulated on the inside of the reaction chamber 22 and an offset value which may be applied to the recipe 24. Plasma power, temperature, and other parameters may be determined by the recipe 24 which may run the deposition system 21.

Automatic deposition compensation system 23 may comprise a calculator 231 and a memory 232.

Calculator 231 may calculate an accumulated layer thickness deposited on the inside of the reaction chamber by the deposition system 21. Deposition system 21 may run as a function of the recipe 24 run in the reaction chamber 22.

The calculator 231 also may calculate an offset value (y) as a function of the accumulated layer thickness. In this specification, the offset value is referred as y and the accumulated layer thickness is referred as x.

As shown in FIG. 1, the automatic deposition compensation system 23 may be connected to the deposition system 21 to adjust the recipe 24 ran by the deposition system with the offset value (y).

User interface 233 may be configured to receive values from operator(s). The user interface operably connected to the automatic deposition compensation system 23 and the user interface 233 configured to receive values from an operator.

The values may be used as coefficients of an equation which may be used to derive the offset value (y).

And in memory 232, the values received in the user interface 233 may be saved for use in equation chosen for deriving offset value (y).

Figure 3:
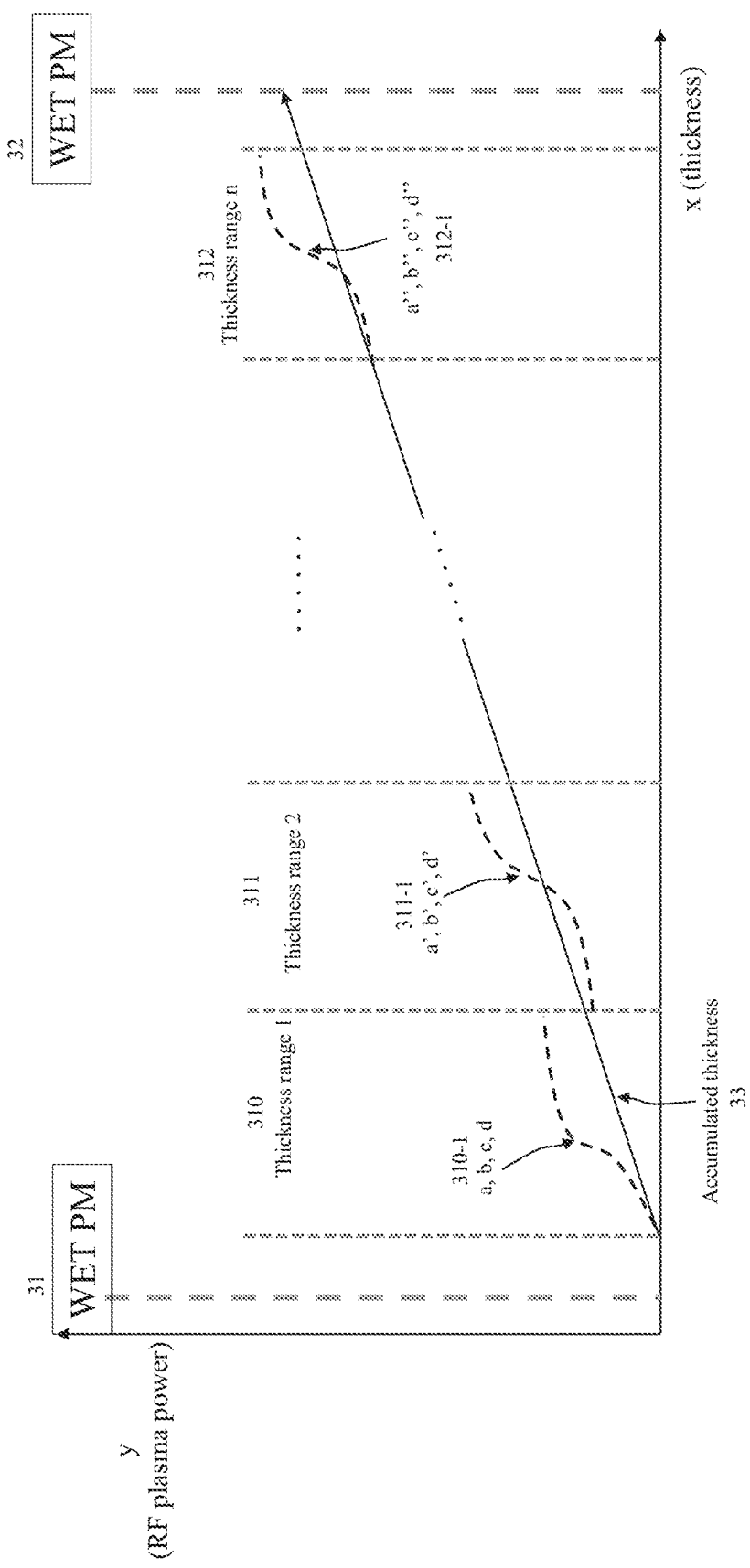
FIG. 3. shows a diagram of automatic compensation of substrate thickness in different thickness range (current thickness of the substrate) and different coefficient values according to an embodiment of the present disclosure.

FIG. 3 shows how the values, i.e., coefficients may be used in the present disclosure's compensation. Any equation may be used for deriving offset value (y) which may be used to update the recipe. In FIG. 3, a cubic equation (i.e., $y=a \cdot x^3+b \cdot x^2+c \cdot x+d$) may be used for getting offset value (y).

The coefficients a, b, c, and d may be saved in the memory 232. This equation is an example and any one of from linear ($y=ax+b$), quadratic ($y=ax^2+bx+c$), cubic ($y=ax^3+bx^2+cx+d$), or higher order equation ($y=ax^4+bx^3+cx^2+dx+e$, . . . ) may be used.

In FIG. 3, thickness range 1 (310), thickness range 2 (311) and thickness range n (312) have separate sets of coefficients (a, b, c, d), (a', b', c', d') and (a", b", c", d") for cubic equation respectively 310-1, 311-1, 312-1 and the coefficient sets (a, b, c, d), (a', b', c', d') and (a", b", c", d") may be saved in memory 232. Although the line of accumulated thickness 13 and the lines of current thickness 14-1, 14-2, 14-3 in FIG. 1 are seemingly straight, it may be noted that the lines are not straight. That is because accumulated thickness 13 may be increasing nevertheless but the increment is not constant. That is why equation of more than order of 2 may be better than linear equation for deriving offset value (y) to be applied to recipe. Between prevention maintenances 31, 32, the recipe may be changed with an offset value (y) so that the thickness of the substrate would not increase indefinitely as the accumulated thickness 33 indicated.

In FIG. 3, user interface 233 may receive values from operator(s). The received values may be the coefficients of the cubic equation 4142 in FIG. 4. It should also be noted that this cubic equation 4142 is chosen for example and linear, quadratic or higher-order (more than 4) equation may be used. As shown, in each thickness range (310, 311 312) there may exist different coefficient sets. That means different coefficients may be used for different thickness range.

The received values may be saved in the memory 232 and may be used as coefficients of an equation chosen for getting offset value (y).

The accumulated layer thickness (x) in reaction chamber 22 may be calculated in the calculator 231 and along with the values (a, b, c, and d) they may be used to in a cubic equation $ax^3+bx^2+cx+d$ and the result value of the equation, y, may be an offset value that may be used to adjust recipe 24.

When the reaction chamber is cleaned, the residue in the chamber may be cleaned and the current thickness may return to the target thickness value set by original, unchanged recipe 10 just like current thickness 14-1, 14-2, and 14-3 in FIG. 1.

The substrate may be processed in the reaction chamber 22 by the deposition system 21. But the conditions, for example generated plasma power and deposited thickness on the reaction chamber 22, may be monitored by sensors (not drawn) and the values may be returned to the control unit 243. These feed-back information (such as accumulated layer thickness (x)) may be used in the equation.

Figure 4:
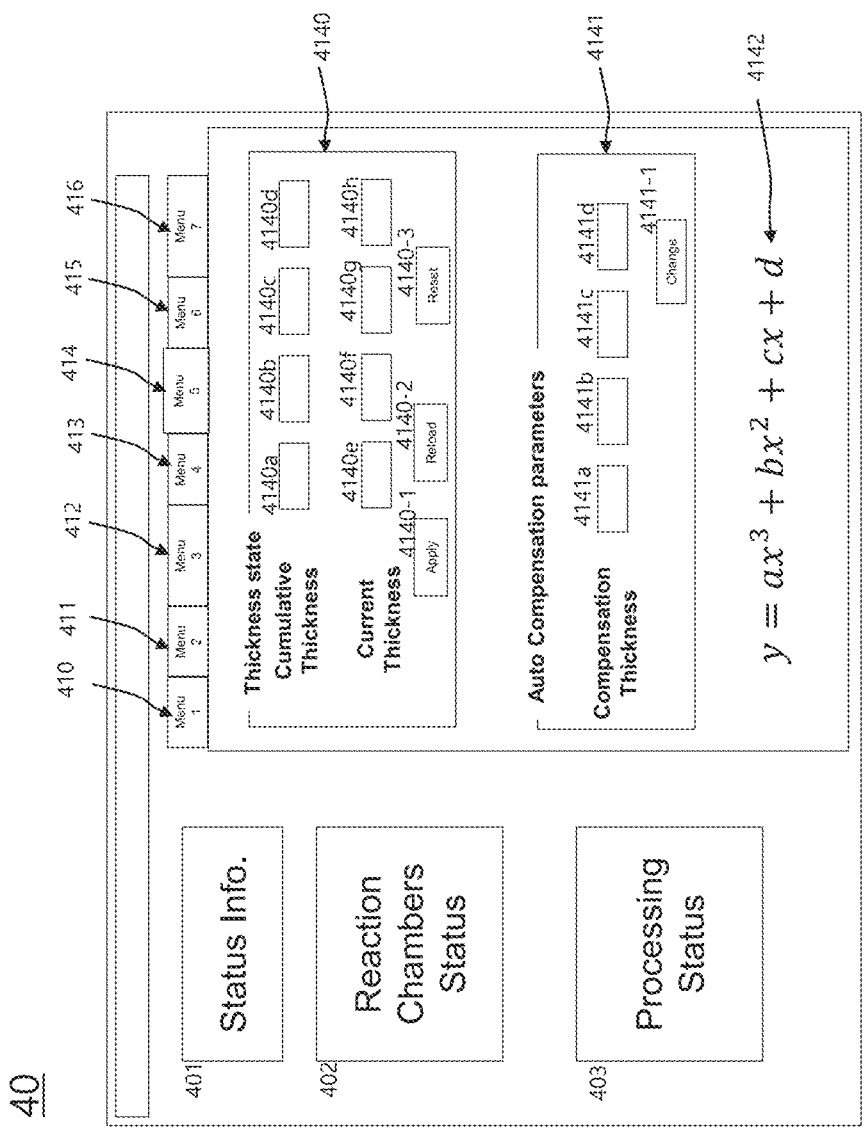
FIG. 4. shows an example view of output unit displaying input value fields according to an embodiment of the present disclosure.
Figure 5:
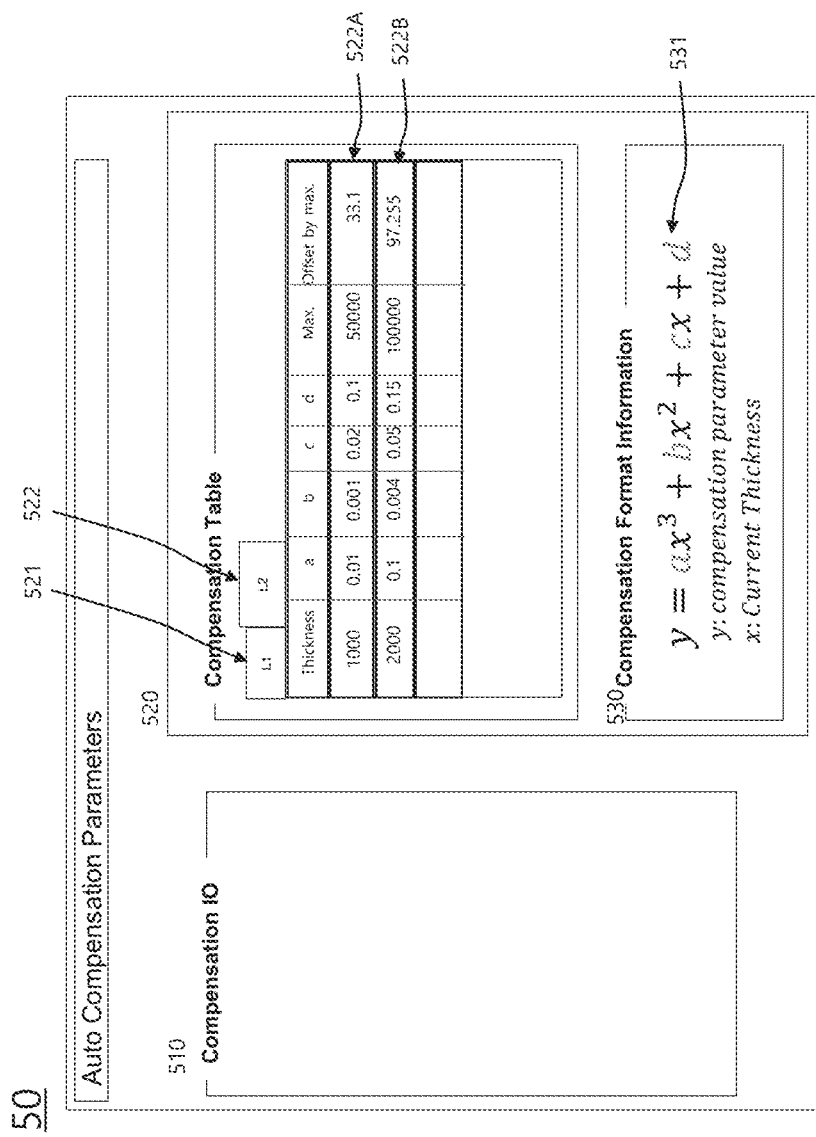
FIG. 5. shows another example view of output unit displaying values for deriving the offset value for compensation according to an embodiment of the present disclosure.

FIGS. 4 and 5 show display examples of user interface 233.

In FIG. 4, the thickness status of current thickness 4140*e*~4140*h* and cumulative thickness 4140*a*~4140*d* is displayed along with the parameters for compensation thickness 4141.

In FIG. 5, it is shown that there may be 2 levels 521, 522 in the compensation. Each level may have its own value environment such as different thickness, different plasma power and different equation.

There may be a multiple of levels L1 & L2 521, 522. Each level may have its own value range. For example, the thickness is 1000 and values a, b, c and d are shown in 522A. These values may be saved in the memory 232. And in 522B, thickness is 2000 and another values of a, b, c and d are shown.

So, the values of 522A may be applied to thickness range 1 (310) in FIG. 3 and the values of 522B may be applied to thickness range 2 (311) in FIG. 3 for example. This means the values of a, b, c, din 310-1 are 0.01, 0.001, 0.02 and 0.1 respectively, and the values of a', b', c', d' in 311-1 are 0.1, 0.004, 0.05, 0.15 respectively. The value of accumulated layer thickness (x) from reaction chamber 22 may tend to increase throughout the entire deposition processes and the offset values may be calculated differently from thickness range to thickness range as shown in FIG. 3.

FIG. 4's 4142 and FIG. 5's 531 show the chosen equation for getting the offset value (y). In the figures, a cubic equation ($y=a \cdot x^3+b \cdot x^2+c\ x+d$) may be chosen for this purpose. The cubic equation may be only used for RF (radio frequency) powered deposition apparatus.

Figure 6:
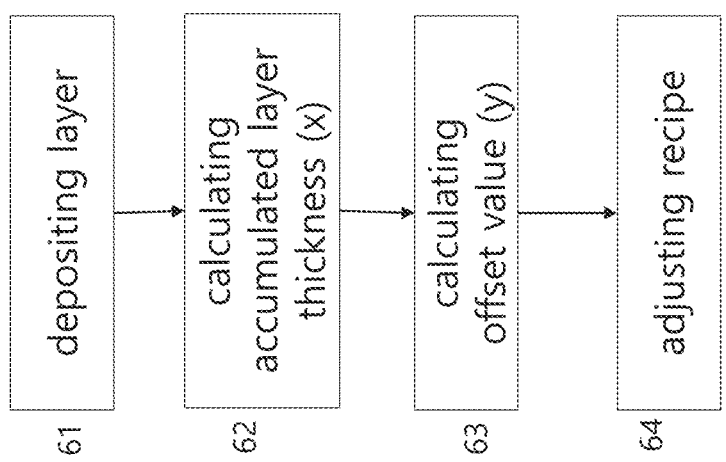
FIG. 6 shows a flow chart diagram of an automatic compensation method according to another embodiment of the present disclosure.

FIG. 6 depicts a diagram of substrate processing method according to an embodiment of the present disclosure. The method is to be explained below.

In the reaction chamber, a substrate may be placed and may be deposited with a deposition system (61). This deposition process can leave residues in the reaction chamber so the need to offset the added thickness may arise.

For this purpose, the accumulated layer thickness (designated as x) deposited on the inside of the reaction chamber by the deposition system as a function of the recipe run in the reaction chamber with an automatic deposition compensation system may be calculated. The automatic deposition compensation system may comprise a calculator which may be used to calculate x (62).

After x, the offset value (designated as y) may be calculated as a function of x (accumulated layer thickness) at the calculator (63) and the recipe on which deposition system runs may be adjusted with the offset value (y) (64).

The equation in (63) may be one of a linear, quadratic, cubic, and higher order equation. A cubic equation ($y=ax^3+bx^2+cx+d$) may be used especially only for RF (radio frequency) power. In the equation, y means offset value, and x means accumulated layer thickness, and a, b, c, d are arbitrary values.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. A substrate processing apparatus comprising:
    a substrate reaction chamber configured to hold a substrate;
    a deposition system to deposit a layer on the substrate according to a recipe;
    an automatic deposition compensation system connected to the deposition system and comprising a calculator and memory, wherein the automatic deposition compensation system:
        calculates, using the calculator, an accumulated layer thickness (x) deposited inside the substrate reaction chamber by the deposition system as a function of a recipe run in the substrate reaction chamber;
        stores, in the memory, the accumulated layer thickness (x);
        compares the accumulated layer thickness (x) to a first thickness range and a second thickness range that is different from the first thickness range;
        determines that the accumulated layer thickness (x) falls within either the first thickness range or the second thickness range;
        calculates, using the calculator, an offset value (y), wherein the offset value (y) is a function of the accumulated layer thickness (x), and wherein the offset value (y) is further calculated based on whether the accumulated layer thickness (x) falls within the first thickness range or the second thickness range; and
        adjusts, using the automatic deposition compensation system, the recipe run by the deposition system, based on the offset value (y) that was calculated.

2. The apparatus according to claim 1, wherein the offset value (y) is derived from an equation, wherein the equation is selected from one or more of a linear equation, a quadratic equation, or a cubic equation.

3. The apparatus according to claim 2, wherein the offset value (y) is derived by the cubic equation, wherein the cubic equation comprises:
    $y=ax^3+bx^2+cx+d$, (y: offset value, x: accumulated layer thickness, a, b, c, d: arbitrary values).

4. The apparatus according to claim 3, wherein the apparatus is provided with a user interface operably connected to the automatic deposition compensation system and programmed so that the values a, b, c and d can be entered via the user interface into the system.

5. The apparatus according to claim 3, wherein a, b, c, and d are determined based on whether the accumulated layer thickness (x) falls within the first thickness range or the second thickness range.

6. The apparatus according to claim 2, wherein the apparatus is a plasma enhanced deposition apparatus provided with a plasma generator and the cubic equation is used to adjust a plasma power of the plasma generator.

7. A substrate processing apparatus comprising:
    a reaction chamber configured to hold a substrate;
    a deposition system to deposit a layer on the substrate according to a recipe;
    an automatic deposition compensation system comprising a calculator programmed to:
        calculate an accumulated layer thickness (x) deposited inside the reaction chamber by the deposition system as a function of a recipe run in the reaction chamber;
        compare the accumulated layer thickness (x) to a first thickness range and a second thickness range that is different from the first thickness range; and
        calculate an offset value (y), wherein the offset value (y) is a function of the accumulated layer thickness (x), and wherein the offset value (y) is further calculated based on whether the accumulated layer thickness (x) falls within the first thickness range or the second thickness range, and wherein the automatic deposition compensation system adjusts the recipe run by the deposition system based on the offset value (y);
    a user interface operably connected to the automatic deposition compensation system and the user interface configured to receive values from an operator; and
    a memory unit configured to save the values.

8. The apparatus according to claim 7, wherein the offset value (y) is derived by a cubic equation: $y=ax^3+bx^2+cx+d$, (y: offset value, x: accumulated layer thickness, a, b, c, d: values saved in the memory unit).

9. The apparatus according to claim 8, wherein a, b, c, and d are determined based on whether the accumulated layer thickness (x) falls within the first thickness range or the second thickness range.

* * * * *